United States Patent
Schneider

(10) Patent No.: US 8,140,488 B2
(45) Date of Patent: Mar. 20, 2012

(54) REDUCING MEMORY REQUIRED FOR PREDICTION BY PARTIAL MATCHING MODELS

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 416 days.

(21) Appl. No.: 12/393,987

(22) Filed: Feb. 26, 2009

(65) Prior Publication Data

US 2010/0228703 A1  Sep. 9, 2010

(51) Int. Cl.
*G06F 7/00* (2006.01)
*G06F 17/00* (2006.01)

(52) U.S. Cl. .................. 707/688; 707/693; 707/797

(58) Field of Classification Search .................. 707/688, 707/693, 797
See application file for complete search history.

(56) References Cited

U.S. PATENT DOCUMENTS

| | | | | |
|---|---|---|---|---|
| 5,627,533 A * | 5/1997 | Clark | ................................ | 341/51 |
| 5,781,906 A * | 7/1998 | Aggarwal et al. | ...... | 707/999.003 |
| 5,889,993 A * | 3/1999 | Kroeger et al. | ................ | 717/128 |
| 7,669,195 B1 * | 2/2010 | Qumei | ........................... | 717/170 |
| 7,999,704 B2 * | 8/2011 | Fitzek et al. | ..................... | 341/50 |
| 2005/0198470 A1 * | 9/2005 | Kirovski et al. | .............. | 712/210 |
| 2007/0233477 A1 * | 10/2007 | Halowani et al. | ............. | 704/232 |
| 2009/0177799 A1 * | 7/2009 | Fitzek et al. | ................. | 709/247 |
| 2009/0216787 A1 * | 8/2009 | Wang et al. | .................. | 707/101 |
| 2010/0121826 A1 * | 5/2010 | Mitsuhashi | ................... | 707/693 |

OTHER PUBLICATIONS

Wikipedia, "Prediction by Partial Matching", last modified: Sep. 20, 2008, accessed at: http://en.wikipedia.org/wiki/Prediction_by_partial_matching, accessed Dec. 17, 2008, 2 pages.
Wikipedia, "B-tree", last modified: Dec. 16, 2008, accessed at: http://en.wikipedia.org/wiki/B-tree, accessed Dec. 17, 2008, 8 pages.
Wikipedia, "Binary tree", last modified: Dec. 14, 2008, accessed at: http://en.wikipedia.org/wiki/Binary_tree, accessed Dec. 17, 2008, 7 pages.

* cited by examiner

*Primary Examiner* — Phong Nguyen
(74) *Attorney, Agent, or Firm* — Lowenstein Sandler PC

(57) ABSTRACT

Some embodiments of a method and an apparatus to reduce memory required for prediction by partial matching (PPM) models usable in data compression have been presented. In one embodiment, statistics of received data are accumulated in a tree of dynamic tree-type data structures. The data is compressed based on the statistics. The tree of dynamic tree-type data structures may be stored in a computer-readable storage medium.

20 Claims, 4 Drawing Sheets

REDUCING MEMORY REQUIRED FOR PREDICTION BY PARTIAL MATCHING MODELS

TECHNICAL FIELD

Embodiments of the present invention relate to data compression, and more specifically to reducing memory required for prediction by partial matching (PPM) models used in data compression.

BACKGROUND

With the advance in computing, more and more data is generated and as a result, a significant problem arises in both storage and transmission of data as the volume of data explodes. As used herein, the term "data" broadly refers to electronic representation of information, such as, for example, source code of software, documents, video files, audio files, graphic files (e.g., bitmaps), etc. One common solution for handling large volumes of data is data compression. For instance, data may be compressed before being stored in order to save storage space. Likewise, data may be compressed before being transmitted in order to reduce network bandwidth used in transmission.

One conventional data compression technique is adaptive data compression using prediction by partial matching (PPM) models. The compression algorithm generally works by collecting statistics of input symbols that have been seen in an input stream of data, then relating the statistics to the last several symbols seen. The maximum number of symbols that can be used in an attempted match is the order of the model. For instance, an order three model may use up to the last three input symbols to try to find a prediction for a current input symbol.

In one conventional implementation of a PPM model, the statistics are stored in a collection of fixed-size, static tables, where each table contains a large collection of links and counts, one link and one count for each possible input symbol. For example, in a model used on an input stream of 8-bit bytes, there may be 256 links and counts, and in some cases, an additional link to a preceding context, and an additional count of a special purpose pseudo code used to signal that the current input symbol has not been seen in this context before. For short contexts, the above approach is generally acceptable in terms of memory usage because the tables tend to fill up. However, at longer contexts, most of the links and counts in the tables are likely never used. As such, much of the space allocated to the tables is wasted.

In addition to the waste of space, the above conventional compression technique also tends to be slow for longer contexts because over half of the entries, on average, in a used table are read whenever an input symbol is coded. The counts for about half of the entries are added together to arrive at the starting point for the range spanned by the found input symbol. Such computing may take a long time and thus, leading to slower compression for longer contexts.

BRIEF DESCRIPTION OF THE DRAWINGS

The present invention is illustrated by way of example, and not by way of limitation, in the figures of the accompanying drawings and in which.

DETAILED DESCRIPTION

Figure 1:
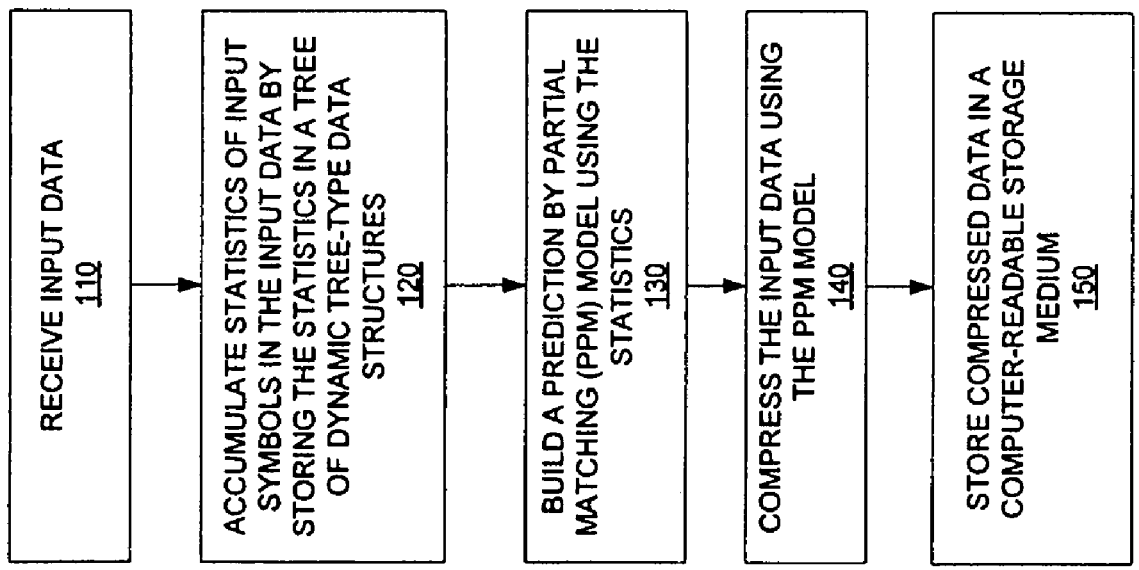
FIG. 1 illustrates a flow diagram of one embodiment of a method to reduce memory required for PPM models.

Described herein are some embodiments of a method and an apparatus to reduce memory required for prediction by partial matching (PPM) models used in data compression. In one embodiment, statistics of data received are accumulated in a tree of dynamic tree-type data structures. As used herein, a dynamic tree-type data structure broadly refers to a tree-type data structure having organizational characteristics that may change during runtime, such as a b-tree, a binary tree, etc. Note that the tree may include a combination of different kinds of dynamic tree-type data structures. For instance, the tree may include both a b-tree and a binary tree. The data received is then compressed based on the statistics. The tree of dynamic tree-type data structures is stored in a computer-readable storage medium. In some embodiments, the data includes source code of software and the compressed source code is stored in a source code archive. Alternatively, the data may include audio files, video files, graphic files, etc., and the compressed data may be stored or transmitted over a network to another device, such as a personal computer, a media player, a cellular telephone, etc.

By using dynamic tree-type data structures to store the statistics, instead of using fixed-size, static tables as in some conventional approach discussed above, less space is used to store the statistics because there are fewer empty links and empty counts in the dynamic tree-type data structures. Moreover, in some embodiments, the dynamic tree-type data structures include total count fields, which are used to compute statistics in the model, instead of adding about half of the entries in each dynamic tree-type data structures. As a result, the computation of the statistics become faster than the conventional approach. More details of some embodiments of the method and apparatus to reduce memory required for PPM models are described below.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions below are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present invention also relates to apparatus for performing the operations herein. This apparatus may be specially constructed for the required purposes, or it may comprise a general-purpose computer selectively activated or reconfigured by a computer program stored in the computer. Such a computer program may be stored in a computer-readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required operations. The required structure for a variety of these systems will appear from the description below. In addition, the present invention is not described with reference to any particular programming language. It will be appreciated that a variety of programming languages may be used to implement the teachings of the invention as described herein.

FIG. 1 illustrates a flow diagram of one embodiment of a method to reduce memory required for PPM models used in data compression. The method may be performed by processing logic that may comprise hardware (e.g., circuitry, dedicated logic, programmable logic, microcode, etc.), software (such as instructions run on a processing device), firmware, or a combination thereof. For example, the method may be performed by the adaptive data compressing machine 200 illustrated in FIG. 2 as discussed below in some embodiments.

Initially, processing logic receives input data to be compressed later (processing block 110). The input data may include numerous input symbols, such as alphanumerical symbols. Furthermore, these input symbols may be arranged in a particular sequence and each input symbol may appear in the input data at a particular frequency. Processing logic accumulates statistics of the input symbols in the input data by storing the statistics in a tree of dynamic tree-type data structures (processing block 120). The statistics may include counts of the appearances of various input symbols in the input data, counts of the appearances of various combinations of the input symbols (which may also referred to as patterns) in the input data, etc. The dynamic tree-type data structures may include b-trees, binary trees, etc.

Using the statistics accumulated, processing logic may build a prediction by partial matching (PPM) model (processing block 130). Then processing logic compresses the input data using the PPM model (processing block 140). In some embodiments, processing logic stores the compressed data in a computer-readable storage medium, such as an external storage device (e.g., a source code archive, a database, etc.) or a local storage device (e.g., a hard drive). (processing block 150). Alternatively, processing logic may transmit the compressed data over a network to one or more networked devices, such as a server, a personal computer, a media player, a cellular telephone, etc.

Figure 2:
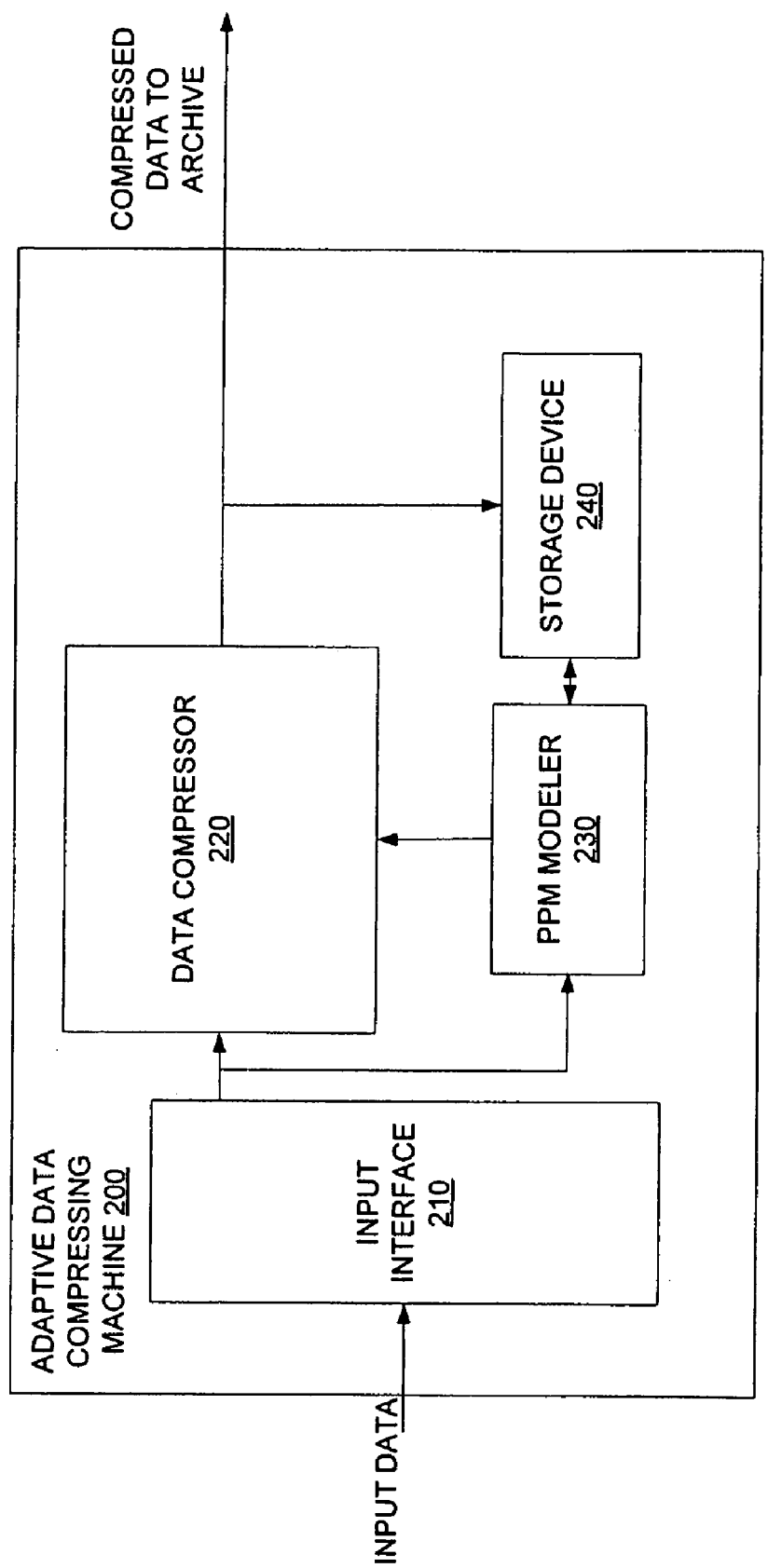
FIG. 2 illustrates one embodiment of an adaptive data compressing machine.

FIG. 2 illustrates one embodiment of an adaptive data compressing machine. The adaptive data compressing machine 200 may be implemented using a computer system (e.g., a server, a personal computer, a media player, etc.). One exemplary computer system usable to implement the adaptive data compressing machine 200 is shown in details in FIG. 4.

In some embodiments, the adaptive data compressing machine 200 includes an input interface 210, a data compressor 220, a PPM modeler 230, and a storage device 240, which includes a computer-readable storage medium. The input interface 210 is coupled to a first input of the data compressor 220 and an input of the PPM modeler 230. An output of the PPM modeler 230 is coupled to a second input of the data compressor 220. The PPM modeler 230 is further coupled to the storage device 240. The output of the data compressor 220 may be coupled to the storage device 240 as well.

In some embodiments, the input interface 210 receives input data. The input data may be received over a network from another networked device, such as a server, a personal computer, a media player, etc. Alternatively, the input data may be from another module within the same computer system that implements the adaptive data compressing machine 200. The input data contains a string of input symbols, such as alphanumerical symbols. The input interface 210 forwards the input data to the data compressor 220 and the PPM modeler 230. The PPM modeler 230 accumulates the statistics of the input symbols in the input data to generate a PPM model usable by the data compressor 220. In some embodiments, the PPM modeler 230 stores the statistics of the input symbols in a tree of dynamic tree-type data structures, such as b-trees, binary trees, etc., to generate the model. Details of one embodiment of the dynamic tree-type data structure are illustrated by an example below. The statistics accumulated are stored in the computer-readable storage medium of the storage device 240. The PPM modeler 230 may generate a PPM model using the statistics accumulated and send the PPM model to the data compressor 220.

As previously discussed, adaptive data compression using PPM models relies on the statistics of input symbols in input data to be compressed. The statistics may be related to the last several symbols seen in the input data. The maximum number of symbols that can be used in an attempted match is the order of the PPM model. For example, an order three model may use up to the last three input symbols in the input data to try to find a prediction for the current input symbol. Using the PPM model from the PPM modeler 230, the data compressor 220 performs adaptive data compression on the input data. For example, the data compressor 220 may predict what the current input symbol in the input data may be using the PPM model. Based on the prediction, the data compressor 220 may compress the input data accordingly. The data compressor 220 then outputs the compressed data, which may be sent to another device, such as an archive, a database, a media player, etc. Alternatively, the data compressor 220 may store the compressed data in the storage device 240 within the adaptive data compressing machine 200.

In some embodiments, the statistics of the input symbols in the input data are stored in a tree of dynamic tree-type data structures, such as a b-tree using very small blocks (such as blocks for holding only four or eight symbols worth of information), instead of a tree of static, fixed-size tables. The original table structure may contain a pointer to a preceding shorter context, if any, and the total count for the table, and then a pointer to the root block of the b-tree holding the actual symbol data.

In some embodiments, the input symbol data blocks may hold a small number of records, where each record contains an input symbol and its associated count. In some embodiments, each data block may additionally hold the total count for all the symbols it spans, which includes all of the data blocks referenced from the given data block. To further illustrate the above concept of using dynamic tree-type data structures to store the statistics of input data, an example is discussed in details below.

In one example, the input data includes a string, "abracadabra," and the adaptive data compressing machine 200 uses an order-0 model, with four symbols per data block. Based on the frequencies of occurrences of the input symbols "a," "b," "c," "d," and "r," the PPM modeler 230 would generate a tree having the following blocks:
Root block:
Count—12
Before pointer—nil
Symbols:
ESC—count 1, following pointer "ab" block
"c"—count 1, following pointer "dr" block
"ab" block:
Count—7
Before pointer—nil
Symbols:
"a"—count 5, following pointer nil
"b"—count 2, following pointer nil
"dr" block:
Count—3
Before pointer—nil
Symbols:
"d"—count 1, following pointer nil
"r"—count 2, following pointer nil In some embodiments, the total count fields are used to compute statistics in the PPM model. Specifically, instead of adding every count, it suffices to add the count of the block that comes immediately before the symbol is found. For instance, to find the starting offset for the symbol "c," the count for the pattern "ab" is added to the count for the ESC pseudo-symbol to give a sum of eight (8). Thus, the symbol "c" has a range 8-9 out of 12.

Using the above approach, less memory is used to store the statistics of the input data in the PPM model because fewer links and fewer counts in the dynamic tree-type data structures remain empty. In addition, the total count fields in the dynamic tree-type data structures also speed up computation of statistics in the PPM model because there is no need to add all counts every time a total count is computed. Furthermore, the arrangement of the blocks also allows the PPM modeler 230 and the data compressor 220 to traverse the dynamic tree-type data structures more quickly, thus speeding up the data compression.

Figure 3:
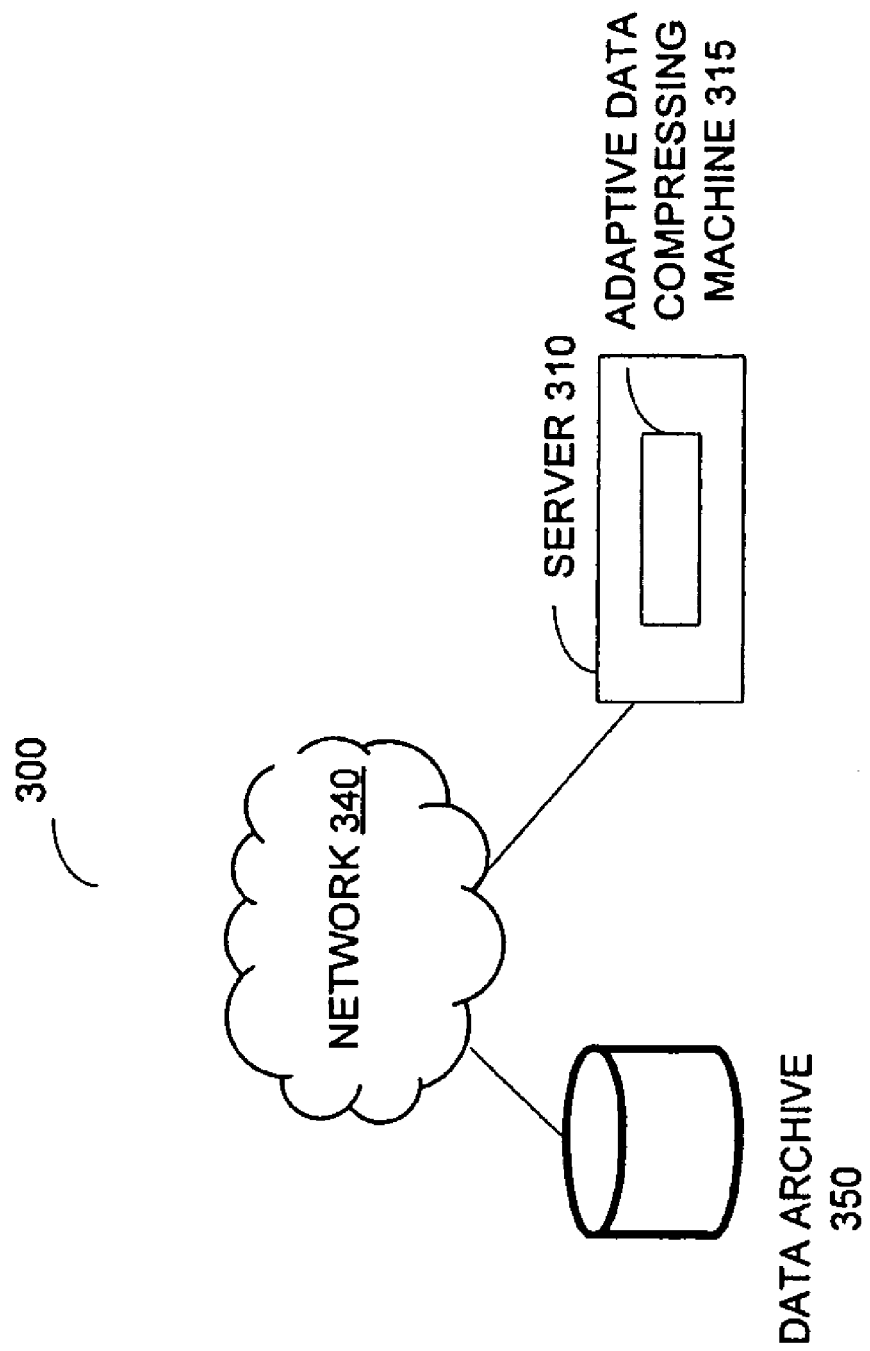
FIG. 3 illustrates one embodiment of a system in which embodiments of the present invention may be implemented.

FIG. 3 illustrates one embodiment of a system in which embodiments of the present invention may be implemented. The system 300 includes a server 310 and a data archive 350, which are coupled to each other via a network 340. The network 340 may include one or more types of networks, such as a local area network (LAN), a wide area network (WAN), an intranet, the Internet, etc. Furthermore, the network 340 may include wirelined and/or wireless networks. In some embodiments, the server 310 and the data archive 350 are part of a data storage system, such as a tape backup system, a file system with large blocks (e.g., a network attached storage (NAS) system), etc.

Note that any or all of the components of the system 300 and associated hardware may be used in various embodiments of the present invention. However, it can be appreciated that other configurations of the system 300 may include more or fewer machines and/or devices than those discussed above. Furthermore, the server 310 and the data archive 350 are illustrative examples of machines communicatively coupled to the network 340. It should be apparent that other types of machines and/or devices may communicatively couple to the network 340 in other embodiments, such as a desktop personal computer (PC), a laptop PC, a personal digital assistant (PDA), a media player, a mobile telephone, etc.

An adaptive data compressing machine 315 (such as the adaptive data compressing machine 200 illustrated in FIG. 2) is implemented in the server 310. The adaptive data compressing machine 315 may compress data from other modules running on the server 310. The adaptive data compressing machine 315 may accumulate statistics of symbols in the data to generate a PPM model. Using the PPM model, the adaptive data compressing machine 315 may perform adaptive data compression on the data. Details of some embodiments of the adaptive data compressing machine 315 and some embodiments of the way the statistics of data may be accumulated and stored for generating the PPM model have been discussed above. In some embodiments, the data includes source code of software. Alternatively, the data may include audio files, video files, graphic data (e.g., bitmaps), etc. The server 310 may store the compressed data in the data archive 350.

Figure 4:
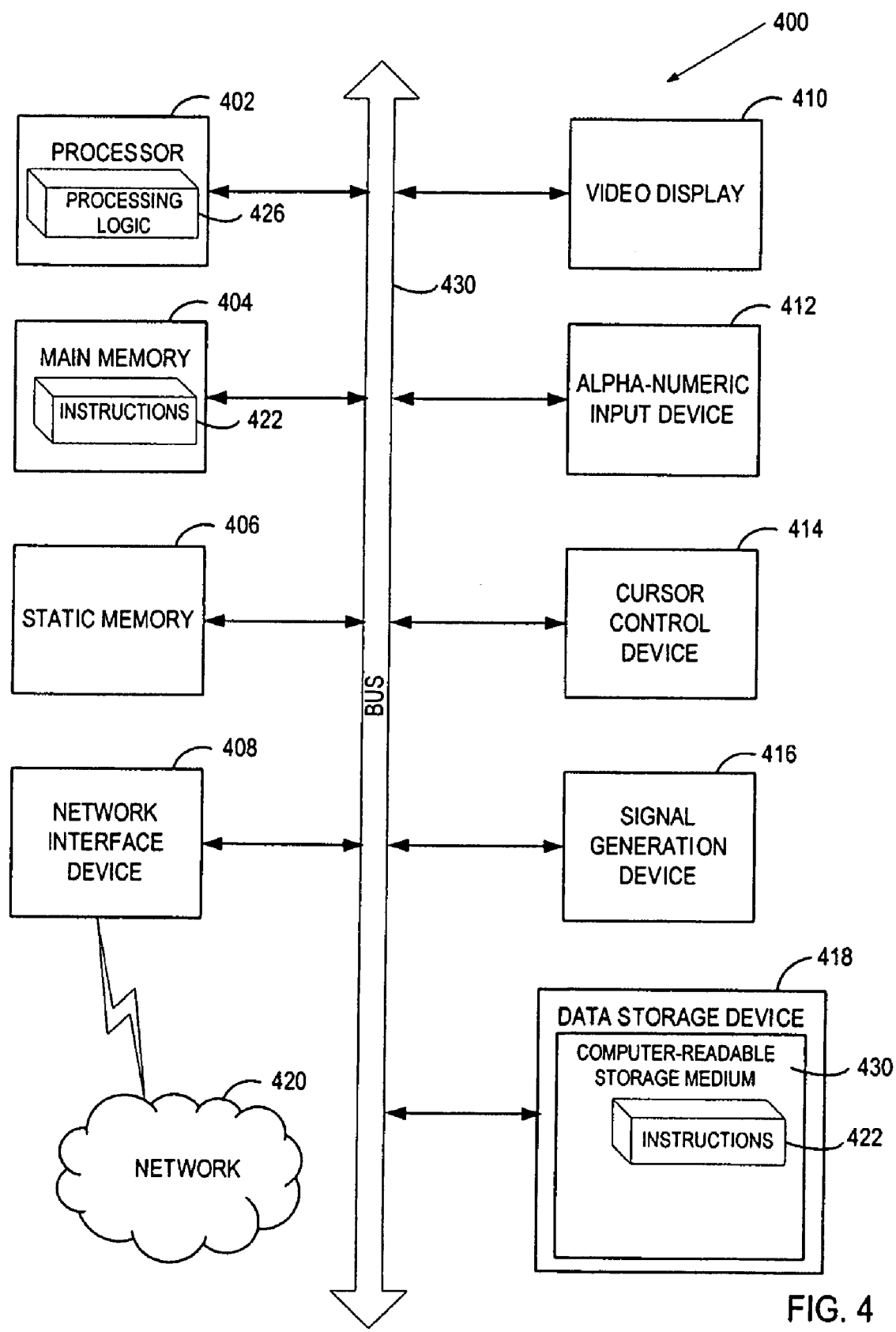
FIG. 4 illustrates a block diagram of an exemplary computer system.

FIG. 4 illustrates a diagrammatic representation of a machine in the exemplary form of a computer system 400 within which a set of instructions, for causing the machine to perform any one or more of the methodologies discussed herein, may be executed. In alternative embodiments, the machine may be connected (e.g., networked) to other machines in a LAN, an intranet, an extranet, and/or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a media player, a cellular telephone, a web appliance, a server, a network router, a switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage device 418, which communicate with each other via a bus 430.

Processing device 402 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 402 may also be one or more special-purpose processing devices such as an application specific integrated circuit (ASIC), a field programmable gate array (FPGA), a digital signal processor (DSP), network processor, or the like. The processing device 402 is configured to execute the processing logic 426 for performing the operations and steps discussed herein.

The computer system 400 may further include a network interface device 408. The computer system 400 also may include a video display unit 410 (e.g., a liquid crystal display (LCD) or a cathode ray tube (CRT)), an alphanumeric input device 412 (e.g., a keyboard), a cursor control device 414 (e.g., a mouse), and a signal generation device 416 (e.g., a speaker).

The data storage device 418 may include a computer-accessible storage medium 430 (also known as a computer-readable storage medium) on which is stored one or more sets of instructions (e.g., software 422) embodying any one or more of the methodologies or functions described herein. The software 422 may also reside, completely or at least partially, within the main memory 404 and/or within the processing device 402 during execution thereof by the computer system 400, the main memory 404 and the processing device 402 also constituting computer-accessible storage media. The software 422 may further be transmitted or received over a network 420 via the network interface device 408.

While the computer-readable storage medium 430 is shown in an exemplary embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present invention. The term "computer-readable storage medium" shall accordingly be taken to include, but not be limited to, solid-state memories, optical and magnetic media, etc.

Thus, some embodiments of a method and an apparatus to reduce memory required for PPM models in data compression have been described. It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A computer-implemented method comprising:
accumulating statistics of received data in a tree of dynamic tree-type data structures;
storing the tree of dynamic tree-type data structures in a computer-readable storage medium; and
compressing the data based on the statistics; wherein each of the dynamic tree-type data structures comprises one or more data blocks, wherein each of the one or more data blocks stores an input symbol in the data, a count associated with the input symbol, and a total count of all input symbols spanned by the respective dynamic tree-type data structure, and wherein the respective dynamic tree-type data structure includes all of the data blocks referenced from the given data block.

2. The method of claim 1, further comprising:
using the statistics in the tree of dynamic tree-type data structures to build a prediction by partial matching (PPM) model, wherein compressing the data comprises performing adaptive compression on the data using the PPM model.

3. The method of claim 1, wherein the dynamic tree-type data structures include a plurality of binary trees.

4. The method of claim 1, wherein the dynamic tree-type data structures include a plurality of b-trees.

5. The method of claim 1, wherein the data includes source code and the computer-readable storage medium is part of a software archive.

6. The method of claim 1, wherein the tree contains a plurality of pointers, each of the plurality of pointers referencing a distinct one of the dynamic tree-type data structures.

7. An apparatus comprising:
a storage device;
a modeler coupled to the storage device, to determine statistics of data received, and to store the statistics in a tree of dynamic tree-type data structures in the storage device; and
a data compressor coupled to the modeler, to compress the data based on the statistics;
wherein each of the dynamic tree-type data structures comprises one or more data blocks, wherein each of the one or more data blocks stores an input symbol in the data, a count associated with the input symbol, and a total count of all input symbols spanned by the respective dynamic tree-type data structure, and wherein the respective dynamic tree-type data structure includes all of the data blocks referenced from the given data block.

8. The apparatus of claim 7, wherein the modeler uses the statistics in the tree of dynamic tree-type data structures to build a prediction by partial matching (PPM) model, wherein the data compressor performs adaptive compression on the data using the PPM model.

9. The apparatus of claim 7, wherein the dynamic tree-type data structures include a plurality of binary trees.

10. The apparatus of claim 7, wherein the dynamic tree-type data structures include a plurality of b-trees.

11. The apparatus of claim 7, wherein the data includes at least one of an audio file, a video file, and a graphic file.

12. The apparatus of claim 7, wherein the tree contains a plurality of pointers, each of the plurality of pointers referencing a distinct one of the dynamic tree-type data structures.

13. A system comprising the apparatus of claim 7, further comprising:
a server on which the modeler and the data compressor are executed; and
a computer-readable storage medium coupled to the server to store the data compressed.

14. The system of claim 13, wherein the server is communicatively coupled to the computer-readable storage medium via a network.

15. A computer-readable storage medium embodying instructions that, when executed by a processor, will cause the processor to perform a method comprising:
accumulating statistics of received data in a tree of dynamic tree-type data structures;
storing the tree of dynamic tree-type data structures in a computer-readable storage medium; and
compressing the data based on the statistics;
wherein each of the dynamic tree-type data structures comprises one or more data blocks, wherein each of the one or more data blocks stores an input symbol in the data, a count associated with the input symbol, and a total count of all input symbols spanned by the respective dynamic tree-type data structure, and wherein the respective dynamic tree-type data structure includes all of the data blocks referenced from the given data block.

16. The computer-readable storage medium of claim 15, wherein the method further comprises:
using the statistics in the tree of dynamic tree-type data structures to build a prediction by partial matching (PPM) model, wherein compressing the data comprises performing adaptive compression on the data using the PPM model.

17. The computer-readable storage medium of claim 15, wherein the dynamic tree-type data structures include a plurality of binary trees.

18. The computer-readable storage medium of claim 15, wherein the dynamic tree-type data structures include a plurality of b-trees.

19. The computer-readable storage medium of claim 15, wherein the data includes source code and the computer-readable storage medium is part of a software archive.

20. The computer-readable storage medium of claim 15, wherein the tree contains a plurality of pointers, each of the plurality of pointers referencing a distinct one of the dynamic tree-type data structures.

* * * * *